US011250751B2

(12) United States Patent
Li et al.

(10) Patent No.: US 11,250,751 B2
(45) Date of Patent: Feb. 15, 2022

(54) SHIFT REGISTER UNIT, GATE DRIVER, DRIVING METHOD THEREOF AND DISPLAY DEVICE

(71) Applicants: HEFEI BOE DISPLAY TECHNOLOGY CO., LTD., Anhui (CN); BOE TECHNOLOGY GROUP CO., LTD., Beijing (CN)

(72) Inventors: Tao Li, Beijing (CN); Liugang Zhou, Beijing (CN); Ke Dai, Beijing (CN); Yizhan Han, Beijing (CN); Jianwei Sun, Beijing (CN); Yulong Xiong, Beijing (CN)

(73) Assignees: HEFEI BOE DISPLAY TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 25 days.

(21) Appl. No.: 16/568,751

(22) Filed: Sep. 12, 2019

(65) Prior Publication Data
US 2020/0211669 A1    Jul. 2, 2020

(30) Foreign Application Priority Data

Jan. 2, 2019 (CN) .......................... 201910014623.7

(51) Int. Cl.
G09G 3/20     (2006.01)
G11C 19/28    (2006.01)
(52) U.S. Cl.
CPC ............... G09G 3/20 (2013.01); G11C 19/28 (2013.01); G09G 2300/0426 (2013.01); G09G 2310/0283 (2013.01); G09G 2310/0286 (2013.01)

(58) Field of Classification Search
CPC .. G11C 19/28; G09G 3/20; G09G 2300/0426; G09G 2310/0283; G09G 2310/0286
See application file for complete search history.

(56) References Cited

U.S. PATENT DOCUMENTS

2010/0141642 A1* 6/2010 Furuta ................. G11C 19/184
                                                       345/213
2017/0270851 A1* 9/2017 Shang ................. G09G 3/2092
(Continued)

FOREIGN PATENT DOCUMENTS

CN    101383133 A    3/2009
CN    103413531 A    11/2013
(Continued)

OTHER PUBLICATIONS

First Office Action for Chinese Application No. 201910014623.7, dated Aug. 24, 2020, 9 Pages.

Primary Examiner — Patrick N Edouard
Assistant Examiner — Eboni N Giles
(74) Attorney, Agent, or Firm — Brooks Kushman P.C.

(57) ABSTRACT

Some embodiments of the present disclosure provide a shift register unit, a gate driver, a driving method thereof and a display device. The shift register unit includes: an output circuit, configured to receive a clock signal and output the clock signal to an output signal terminal under control of a voltage of a pull-up control node; a pull-down control circuit, configured to receive a control voltage signal and control the voltage of the pull-up control node and a voltage of the output signal terminal according to the control voltage signal; and an output control circuit, configured to receive a first voltage signal and the control voltage signal, and control the voltage of the output signal terminal in response to the first voltage signal and the control voltage signal.

14 Claims, 12 Drawing Sheets

(56) References Cited

U.S. PATENT DOCUMENTS

2018/0174548 A1* 6/2018 Hao ................... G11C 19/184
2019/0236995 A1   8/2019 Du et al.

FOREIGN PATENT DOCUMENTS

| CN | 105185349 A | 12/2015 |
| CN | 105355180 A | 2/2016 |
| CN | 106652875 A | 5/2017 |
| CN | 108257568 A | 7/2018 |

* cited by examiner

SHIFT REGISTER UNIT, GATE DRIVER, DRIVING METHOD THEREOF AND DISPLAY DEVICE

CROSS-REFERENCE TO RELATED APPLICATION

This application claims priority to Chinese Patent Application No. 201910014623.7 filed on Jan. 2, 2019, which is incorporated herein by reference in its entirety.

TECHNICAL FIELD

The present disclosure relates to a display field, and in particular to a shift register unit, a gate driver, a driving method thereof and a display device.

BACKGROUND

In a display device based on Thin Film Transistors (TFT), a gate driver for driving gates may be formed on a display panel to form a Gate Driver On Array (GOA) panel. The gate driver includes a plurality of shift register units connected in cascades. In a conventional gate driver, an output signal of a subsequent stage of shift register unit is usually used as a reset signal for the current stage of shift register unit, and an output signal of a previous stage of shift register unit is used as an input signal of the current stage of shift register unit. Generally, various control signals and data signals may be generated by a Timer Controller (TCON).

However, especially in a boot-up period of the display device, an output signal of TCON is unstable, resulting in boot-up noise of the display device, and undesirable picture may be rendered on the display panel.

SUMMARY

Some embodiments of the present disclosure provide a shift register unit, a gate driver, a driving method thereof and a display device.

In one aspect, the present disclosure provides a shift register unit, including:

an output circuit, configured to receive a clock signal and output the clock signal to an output signal terminal under control of a voltage of a pull-up control node;

a pull-down control circuit, configured to receive a control voltage signal and control the voltage of the pull-up control node and a voltage of the output signal terminal according to the control voltage signal; and an output control circuit, configured to receive a first voltage signal and the control voltage signal, and control the voltage of the output signal terminal in response to the first voltage signal and the control voltage signal.

For example, the control voltage signal includes at least one of a first control voltage signal and a second control voltage signal; the output control circuit includes: a first control sub-circuit, configured to generate an output control signal based on at least one of the first control voltage signal and the second control voltage signal; a second control sub-circuit, configured to receive the output control signal and control the voltage of the output signal terminal in response to the first voltage signal and the output control signal.

For example, the first control sub-circuit includes a first transistor and a first resistor; a gate of the first transistor is connected to receive the first control voltage signal, a first electrode of the first transistor is connected to receive a second voltage signal, and a second electrode of the first transistor is connected to a first terminal of the first resistor; a second terminal of the first resistor is connected to a first voltage signal terminal receiving the first voltage signal.

For example, the first control sub-circuit further includes a second transistor; a gate of the second transistor is connected to receive the second control voltage signal, a first electrode of the second transistor is connected to receive the second voltage signal, and a second electrode of the second transistor is connected to the first terminal of the first resistor.

For example, the second control sub-circuit includes a third transistor, a gate of the third transistor is connected to a second electrode of the first transistor and the first terminal of the first resistor, a first electrode of the third transistor is connected to receive the second voltage signal, and a second electrode of the third transistor is connected to the output signal terminal.

For example, the pull-down control circuit includes a first pull-down control circuit;

the first pull-down control circuit includes a fourth transistor, a fifth transistor and a sixth transistor;

a gate and a first electrode of the fourth transistor are connected to receive a first control voltage signal, and a second electrode of the fourth transistor is connected to a gate of the fifth transistor;

a first electrode of the fifth transistor is connected to receive the first control voltage signal, and a second electrode of the fifth transistor is connected to a gate of the sixth transistor; and a first electrode of the sixth transistor is connected to receive a second voltage signal, and a second electrode of the sixth transistor is connected to the output signal terminal.

For example, the first pull-down control circuit further includes a tenth transistor and an eleventh transistor;

a gate of the tenth transistor is connected to the pull-up control node, a first electrode of the tenth transistor is connected to the second electrode of the fourth transistor, and the second electrode of the tenth transistor is connected to receive the second voltage signal;

a gate of the eleventh transistor is connected to the pull-up control node, a first electrode of the eleventh transistor is connected to the second electrode of the fifth transistor, and a second electrode of the eleventh transistor is connected to receive the second voltage signal.

For example, the pull-down control circuit includes a second pull-down control circuit;

the second pull-down control circuit includes a seventh transistor, an eighth transistor and a ninth transistor;

a gate and a first electrode of the seventh transistor are connected to receive a second control voltage signal, and a second electrode of the seventh transistor is connected to a gate of the eighth transistor;

a first electrode of the eighth transistor is connected to receive the second control voltage signal, and a second electrode of the eighth transistor is connected to a gate of the ninth transistor; and a first electrode of the ninth transistor is connected to receive the second voltage signal, and a second electrode of the ninth transistor is connected to the output signal terminal.

For example, the second pull-down control circuit further includes a twelfth transistor and a thirteenth transistor;

a gate of the twelfth transistor is connected to the pull-up control node, a first electrode of the twelfth transistor is connected to the second electrode of the seventh transistor, and the second electrode of the twelfth transistor is connected to receive the second voltage signal;

a gate of the thirteenth transistor is connected to the pull-up control node, a first electrode of the thirteenth transistor is connected to the second electrode of the eighth transistor, and a second electrode of the thirteenth transistor is connected to receive the second voltage signal.

In another aspect, the present disclosure provides a gate driver, including:

a control voltage signal line, configured to provide a control voltage signal;

a first voltage signal line, configured to provide a first voltage signal; and

N stages of the shift register units according to claim 1, wherein N is an integer larger than or equal to 2.

For example, the control voltage signal line includes: a first control voltage signal line, configured to provide a first control voltage signal; and a second control voltage signal line, configured to provide a second control voltage signal.

In another aspect, the present disclosure provides a gate driver, including:

a first voltage signal line, configured to provide a first voltage signal;

a control voltage signal line, configured to provide a control voltage signal;

N shift register units connected in cascades, wherein N is an integer larger than or equal to 2; and N output control circuits;

wherein each of N shift register units connected in cascades includes:

an output circuit, configured to receive a clock signal and output the clock signal to an output signal terminal under control of a voltage of a pull-up control node;

a pull-down control circuit, configured to receive a control voltage signal and control the voltage of the pull-up control node and a voltage of the output signal terminal according to the control voltage signal;

wherein each of N output control circuits is connected to the pull-down control circuit and the output signal terminal of a corresponding shift register unit, and is configured to receive a first voltage signal and the control voltage signal, and control the voltage of the output signal terminal in response to the first voltage signal and the control voltage signal.

For example, the control voltage signal line includes: a first control voltage signal line, configured to provide a first control voltage signal; and a second control voltage signal line, configured to provide a second control voltage signal.

For example, the control voltage signal includes at least one of a first control voltage signal and a second control voltage signal; the output control circuit includes: a first control sub-circuit, configured to generate an output control signal based on at least one of the first control voltage signal and the second control voltage signal; a second control sub-circuit, configured to receive the output control signal and control the voltage of the output signal terminal in response to the first voltage signal and the output control signal.

For example, the first control sub-circuit includes a first transistor and a first resistor; a gate of the first transistor is connected to receive the first control voltage signal, a first electrode of the first transistor is connected to receive a second voltage signal, and a second electrode of the first transistor is connected to a first terminal of the first resistor; a second terminal of the first resistor is connected to a first voltage signal terminal receiving the first voltage signal.

For example, the first control sub-circuit further includes a second transistor; a gate of the second transistor is connected to receive the second control voltage signal, a first electrode of the second transistor is connected to receive the second voltage signal, and a second electrode of the second transistor is connected to the first terminal of the first resistor.

For example, the second control sub-circuit includes a third transistor, a gate of the third transistor is connected to a second electrode of the first transistor and the first terminal of the first resistor, a first electrode of the third transistor is connected to receive the second voltage signal, and a second electrode of the third transistor is connected to the output signal terminal.

In another aspect, the present disclosure provides a display device, including the gate driver according to some embodiments of the present disclosure.

In another aspect, the present disclosure provides a driving method for driving the gate driver, including:

supplying, a first voltage signal line with a first voltage signal; supplying, a first control voltage signal line with a first control voltage signal; and supplying, a second control voltage signal line with a second control voltage signal.

DETAILED DESCRIPTION

Figure 1A:
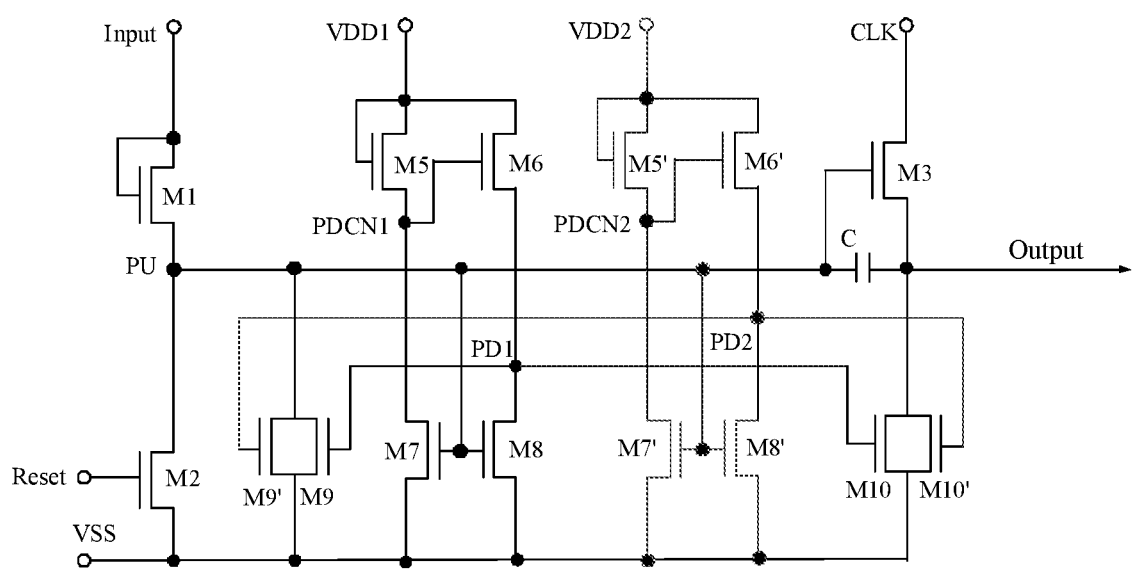
FIG. 1A shows an example circuit of a shift register unit.

In order to make the object, technical solution and merits of the embodiments of the present disclosure clearer, technical solution of the embodiments of the present disclosure will be illustrated clearly and completely hereinafter with reference to the accompanying drawings. Obviously, the embodiments described are part of the embodiments of the present disclosure, not all of them. Based on the described embodiments of the present disclosure, all other embodiments acquired by those skilled in the art without creative work will fall into the protection scope of the present disclosure. It should be noted that, the same element is represented by the same or similar reference sign throughout the accompanying drawings. In the following description, some specific embodiments are used only for a descriptive purpose, and should not be construed as having any limitations on the present disclosure, but only as examples of the embodiments of the present disclosure. Conventional structures or configurations will be omitted when confusion may arise over the understanding of the present disclosure. It should be noted that, shapes and sizes of the components in the accompanying drawings do not reflect true sizes and proportions, but merely indicate the contents of the embodiments of the present disclosure.

Unless defined otherwise, technical or scientific terms in the embodiments of the present disclosure shall be of general meanings understood by those skilled in the art. The terms "first", "second" and similar terms in the embodiments of the present disclosure embodiments do not indicate any order, quantity or importance, but are used only for distinguishing different components.

In addition, in the description of the embodiments of the present disclosure, a term "connected" or "connected" may refer to a direct connection between two components or to a connection between two components via one or more other components. In addition, the two components may be connected or coupled with wires or wirelessly.

In addition, in the description of the embodiments of the present disclosure, the terms "a first level" and "a second level" are used only for distinguishing the difference in magnitude between two levels. For example, the following is described with "a first level" as a high level and "a second level" as a low level. It will be understood by those skilled in the art that the present disclosure is not limited to this.

Transistors in the embodiments of the present disclosure may be thin film transistors or field effect transistors or other devices with the same characteristics. For example, the thin film transistor in the present disclosure embodiment may be an oxide semiconductor transistor. Since the source electrode and the drain electrode of the thin film transistor adopted by the present disclosure are symmetrical, the source electrode and the drain electrode of the thin film transistor may be exchanged. In the embodiments of the present disclosure, one of the source electrode and the drain electrode is referred to as a first electrode, and the other is referred to as a second electrode. The following examples are described by taking N-type thin film transistor as an example. It will be understood by those skilled in the art that the embodiments of the present disclosure may apparently be applied to a case where P-type thin film transistors are used.

In addition, in the description of the embodiments of the present disclosure, a term "effective level" refers to a level capable of conducting switching transistors or circuits. For example, in a case where N-type thin film transistors are used as switching transistors, the "effective level" is a high level, and in a case where P-type thin film transistors are used as switching transistors, the "effective level" is a low level.

Figure 1B:
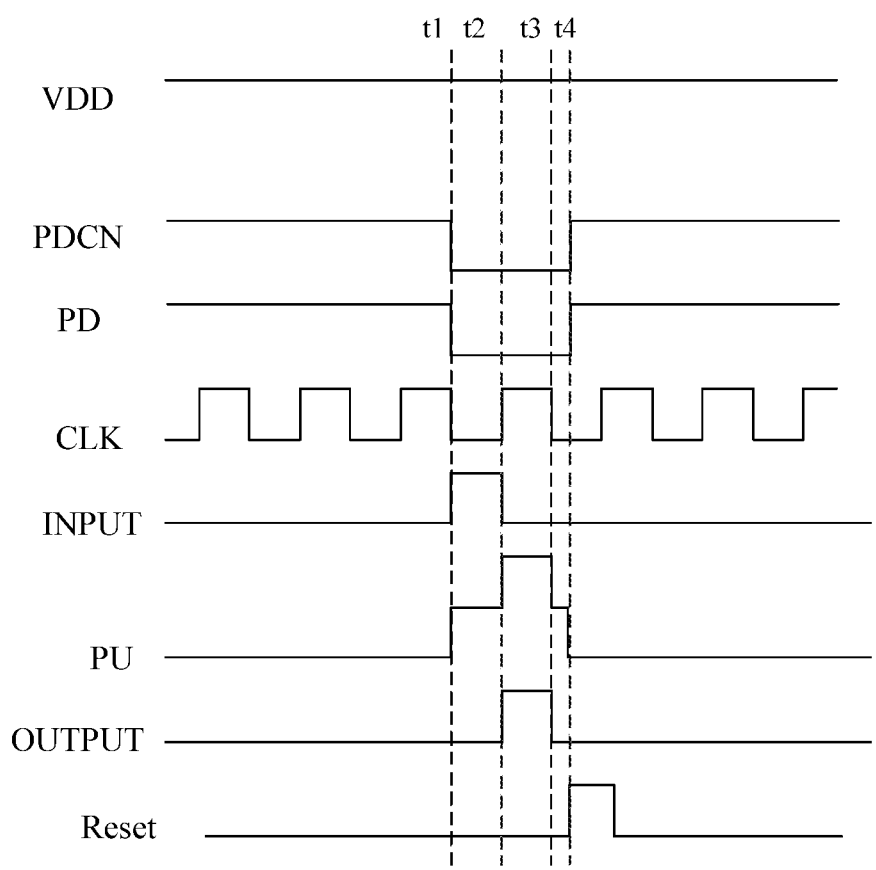
FIG. 1B shows an operation timing diagram of the shift register unit in FIG. 1A.

FIG. 1A shows an example circuit of a shift register unit, FIG. 1B shows an operation timing diagram of the shift register unit in FIG. 1A. The operation of the shift register unit shown in FIG. 1A will be described hereinafter with reference to FIG. 1A and FIG. 1B.

Figure 1C:
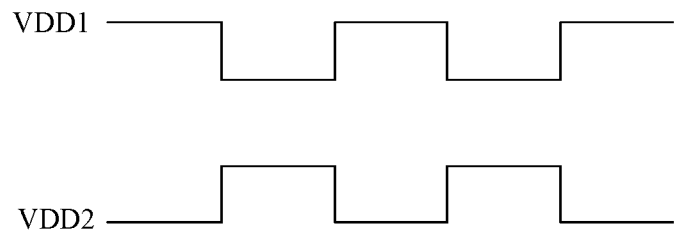
FIG. 1C shows a schematic diagram illustrating an example signal waveform of an ideal first control voltage signal and an ideal second control voltage signal.

In a circuit structure shown in FIG. 1A, the shift register unit includes a first pull-down circuit and a second pull-down circuit. The first pull-down circuit includes transistors M5~M10, and the second pull-down circuit includes transistors M5'~M10'. By alternately controlling a first pull-down node PD1 and a second pull-down node PD2 in response to a first control voltage signal VDD1 and a second control voltage signal VDD2 respectively, are controlled alternately, noise of a pull-up control node PU and a signal output terminal OUTPUT in the shift register unit can be reduced, thereby improving reliability of the shift register unit. For example, an ideal first control voltage signal VDD1 and an ideal second control voltage have a schematic diagram of a signal waveform shown in FIG. 1C, respectively. That is, the first control voltage signal VDD1 and the second control voltage signal VDD2 are reverse signals with a same frequency, that is, there is always one of the first control voltage signal VDD1 and the second control voltage signal VDD2 at an effective level. Therefore, a first pull-down control circuit and a second pull-down control circuit operate alternately. Circuit structure of the first pull-down control circuit is essentially the same as the circuit structure of the second pull-down control circuit. Therefore, the operation of the shift register unit when the first control voltage signal VDD1 is at an effective level (e.g. a high level) is the same as that of the shift register unit when the second control voltage signal VDD2 is at an effective level. In one example, a duration of the first control voltage signal VDD1 and a duration of the second control voltage signal VDD2 are both 2 seconds.

As shown in FIG. 1A, the circuit will be described by taking all switching transistors are N-Channel Metal-Oxide-Semiconductor (NMOS) transistors as an example. The circuit structure shown in FIG. 1A will be described by taking that the first control voltage signal VDD1 is a high level signal, the second control voltage signal VDD2 is a low level signal and a reference signal VSS is a low level signal as an example.

As shown in FIG. 1B, in a period t1, a reset signal of a reset signal terminal Reset and an input signal of an input signal terminal Input are both at a low level, and the first control voltage signal VDD1 is at a high level. At this time, the transistor M5 is turned on, and the first control voltage signal VDD1 is transmitted to a node PDCN1, so that the transistor M6 is turned on. The first pull-down node PD1 is at a high level because of that the transistor M6 is turned on, and then the transistor M9 and M10 are turned on. Thus, a low-level voltage signal VSS is transmitted to the pull-up control node PU and the output signal terminal Output respectively through the transistor M9 and the transistor M10, so as to reduce the noise of the pull-up control node PU and the output signal terminal Output.

In a period t2, the input signal of the input signal terminal Input is at a high level, the transistor M1 is turned on, and the voltage of the pull-up control node PU begins to rise to charge a capacitor C. Since the pull-up control node PU is at a high level, the transistors M7 and M8 are turned on, the low-level voltage signal VSS is transmitted to the node PDCN1 and the first pull-down node PD1 through the transistors M7 M8 respectively. Meanwhile, since the pull-up control node PU is at a high level and a transistor M3 is turned on, the clock signal Clk of the clock signal terminal CLK is transmitted to the output signal terminal Output. At this time, since the clock signal Clk is at a low level, and the output signal of the output signal terminal Output is also at a low level.

In a period t3, the clock signal Clk of the clock signal terminal CLK is at a high level. Under control of pull-up control node PU, the transistor M3 is continuously turned on and the clock signal is transmitted to the output signal terminal Output. At this time, the output signal terminal Output is at a high level. Due to a boosting effect of the capacitor C, the pull-up control node PU is at a higher level.

In a period t4, the reset signal terminal is supplied with a reset signal at a high level, a transistor M2 is turned on, and the pull-up control node PU is pulled down to a low level to reset the pull-up control node PU.

When the first control voltage signal VDD1 is at a high level, the shift register unit enters the t1 period and continuously reduces the noise of the pull-up control node PU and the output signal terminal Output. When the input signal terminal Input of the shift register unit is supplied with a high-level input signal again, the shift register unit repeats the operations of t2 period to t4 period. It is understandable that the first pull-down circuit connected to the first control voltage signal VDD1 works during a period when the first control voltage signal VDD1 is at a high level.

Then, the first control voltage signal VDD1 becomes a low level, the second control voltage signal VDD2 becomes a high level, and the second pull-down circuit connected with the second control voltage signal VDD2 starts to work. In this period, a working principle of the shift register unit is the same as that of the shift register unit in the period that the first control voltage signal VDD1 is at a high-level. The difference is that the second pull-down circuit works while the first pull-down circuit does not work. The transistor M5'~transistor M10' in the second pull-down circuit perform the same operations as the transistor M5~transistor M10 while the first pull-down circuit is working. Therefore, the operations performed by the transistor M5'~transistor M10' will not be described in detail here for the sake of simplicity.

In some display devices, the first control voltage signal, the second control voltage signal, the clock signal, data signals to be displayed and other control signals may be supplied by the timer controller TCON. During the operation of the shift register unit, it is necessary that the first control voltage signal VDD1 and the second control voltage signal VDD2 are always opposite to each other in phase, that is, at the same time, one of the VDD1 and VDD2 is at a high level and the other is at a low level. Otherwise, the operation of the shift register unit will be in disorder and the waveform output of the output signal terminal will be affected. In addition, before the TCON supplying the display device with initial power is ready, the first control voltage signal VDD1 and the second control voltage signal VDD2 cannot be both at a low level, which may cause that the output signal terminal of the shift register unit has no output.

However, before the period of that the TCON supplying the display device with initial power is ready, an unstable state of the timer controller TCON may cause that the first control voltage signal VDD1 and the second control voltage signal VDD2 are both at a low level, for example. The unstable state of the timer controller TCON may cause the output signal terminal of the shift register unit to output a high-level signal, thereby conducting a gate line connected to the shift register unit. Especially when the display panel is a liquid crystal display (LCD) display panel, a deflection of liquid crystal may be caused, so that the display panel may display undesirable pictures.

Figure 2A:
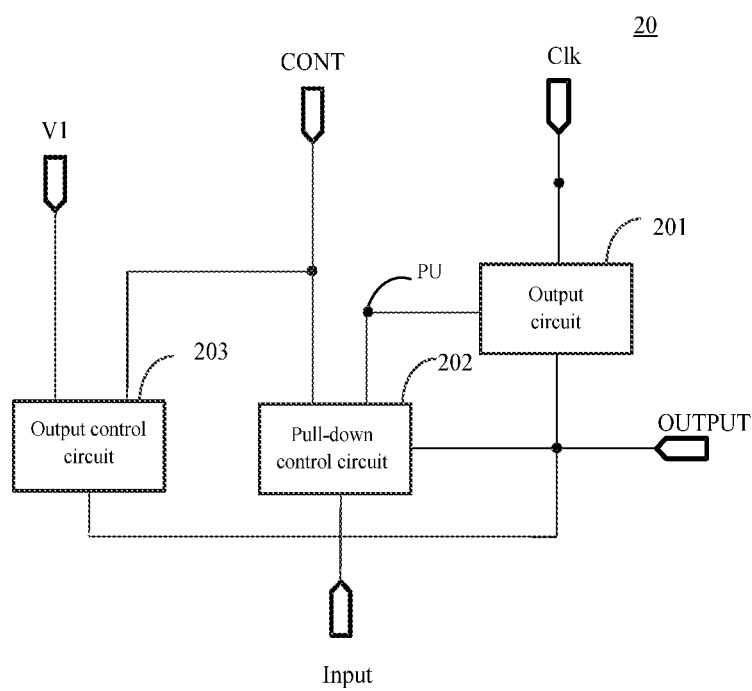
FIG. 2A shows a schematic block diagram of a shift register unit according to some embodiments of the present disclosure.

FIG. 2A shows a schematic block diagram of a shift register unit according to some embodiments of the present disclosure. As shown in FIG. 2A, a shift register unit 20 according to some embodiments of the present disclosure may include an output circuit 201. The output circuit 201 is configured to receive a clock signal Clk and output the clock signal Clk to an output signal terminal OUTPUT under control of a voltage of a pull-up control node PU. The shift register unit 20 may further include a pull-down control circuit 202. The pull-down control circuit 202 is configured to receive a control voltage signal Cont and control the voltage of the pull-up control node PU and a voltage of the output signal terminal according to the control voltage signal Cont. The shift register unit 20 may further include an output control circuit 203. The output control circuit 203 is configured to receive a first voltage signal V1 and the control voltage signal Cont, and control the voltage of the output signal terminal OUTPUT in response to the first voltage signal V1 and the control voltage signal Cont.

According to technical solutions of some embodiments of the present disclosure, by setting the output control circuit, the output signal terminal may maintain at an ineffective level before the TCON supplying the display device with initial power is ready. At the same time, during a normal operation of the shift register unit, an output level of the output signal terminal of the shift register unit may not be affected, so that the shift register unit may output more stable gate driving signal and improve a display quality of the display device.

Figure 2B:
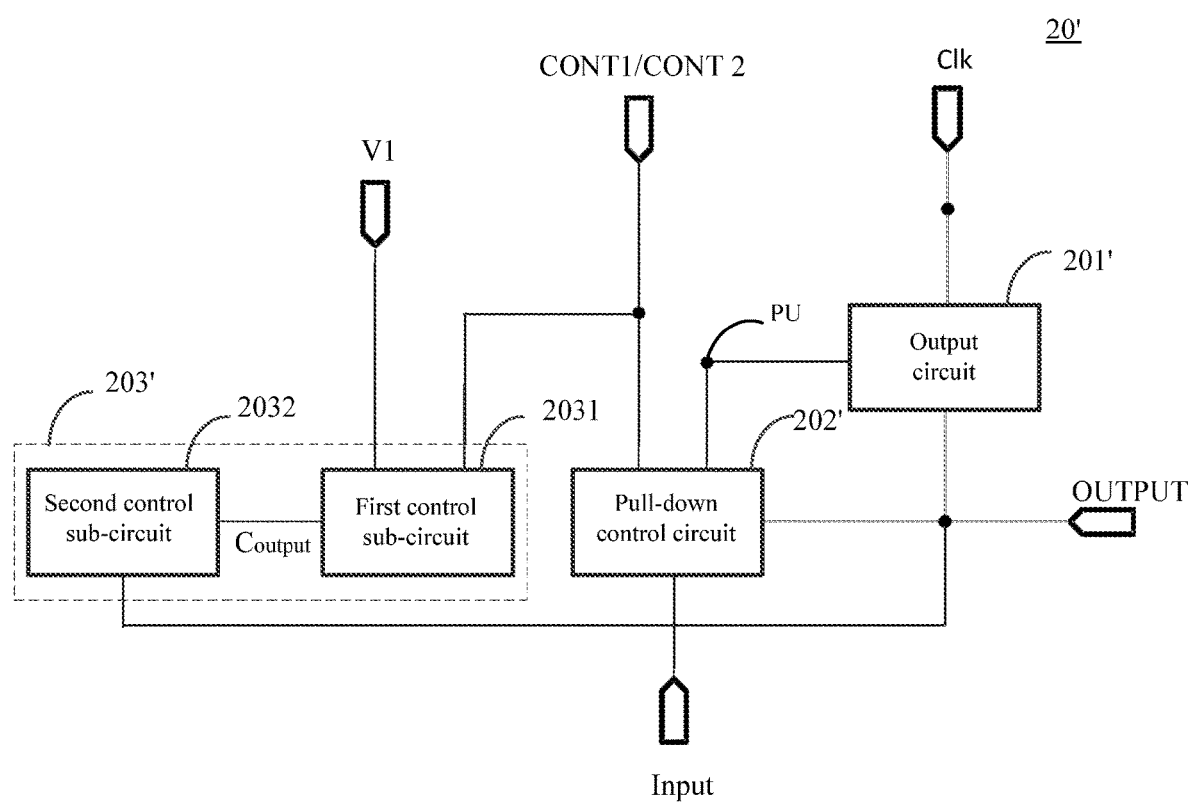
FIG. 2B shows a schematic block diagram of a shift register unit according to some embodiments of the present disclosure.

FIG. 2B shows a schematic block diagram of a shift register unit according to some embodiments of the present disclosure. As shown in FIG. 2B, a shift register unit 20' according to some embodiments of the present disclosure may include an output circuit 201', a pull-down control circuit 202' and an output control circuit 203'. The output control circuit 203' may include a first control sub-circuit 2031 and a second control sub-circuit 2032. The control voltage signal Cont may include at least one of a first control voltage signal Cont1 and a second control voltage signal Cont2. The first control sub-circuit 2031 may be configured to generate an output control signal $C_{output}$ based on at least one of the first control voltage signal Cont1 and the second control voltage signal Cont2. The second control sub-circuit 2032 may be configured to receive the output control signal $C_{output}$ and control the voltage of the output signal terminal OUTPUT in response to the first voltage signal V1 and the output control signal $C_{output}$.

According to an example technical solution shown in FIG. 2B, for example, the output control circuit may include a first control sub-circuit and a second control sub-circuit. The first control sub-circuit may generate an output control signal $C_{output}$ based on at least one of the first control voltage signal and the second control voltage signal. For example, before the TCON supplying the display device with initial power is ready, whether the first control voltage signal and the second control voltage signal are both at a high level, or a low level or one of them is at a high level and the other is at a low level, the first control sub-circuit outputs the corresponding output control signal Coutput, and the second control sub-circuit may control the output signal terminal at an ineffective level based on the first voltage signal V1 and output control signal Coutput, for example, control the output signal terminal at a low level. At the same time, during a normal operation period of the shift register unit, an output level of the output signal terminal of the shift register unit may not be affected.

Figure 2C:
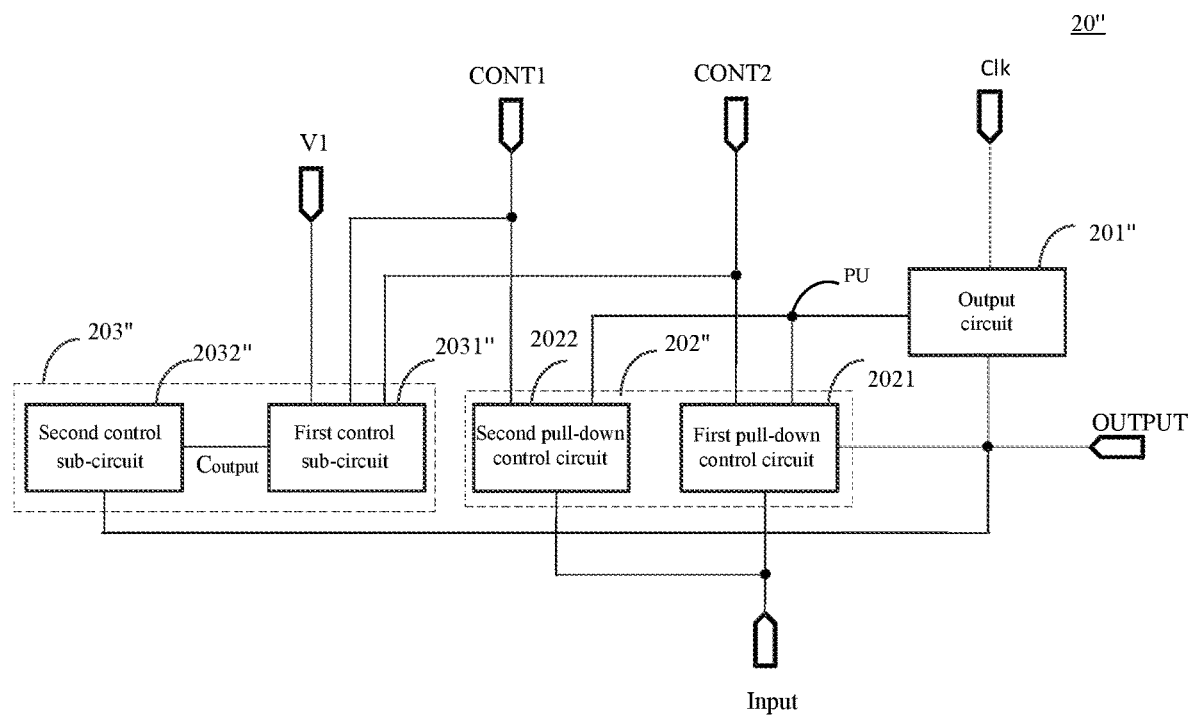
FIG. 2C shows a schematic block diagram of a shift register unit according to some embodiments of the present disclosure.

FIG. 2C shows a schematic block diagram of a shift register unit according to some embodiments of the present disclosure. As shown in FIG. 2C, the control voltage signal Cont may include a first control voltage signal Cont1 and a second control voltage signal Cont2. A shift register unit 20" according to some embodiments of the present disclosure may include an output circuit 201", a pull-down control circuit 202" and an output control circuit 203". The output control circuit 203" may include a first control sub-circuit 2031" and a second control sub-circuit 2032". The first control sub-circuit 2031" may be configured to generate an output control signal $C_{output}$ by receiving the first control voltage signal Cont1 and the second control voltage signal Cont2. The second control sub-circuit 2032" may be configured to receive the output control signal $C_{output}$ and control the voltage of the output signal terminal OUTPUT in response to a first voltage signal V1 and the output control signal $C_{output}$. According to some embodiments of the present disclosure, the pull-down control circuit 202" may include a first pull-down control circuit 2021 and a second pull-down control circuit 2022. The first pull-down control circuit 2021 may be connected to the first control voltage signal Cont1, the second pull-down control circuit 2022 may be connected to the second control voltage signal Cont2.

Figure 3A:
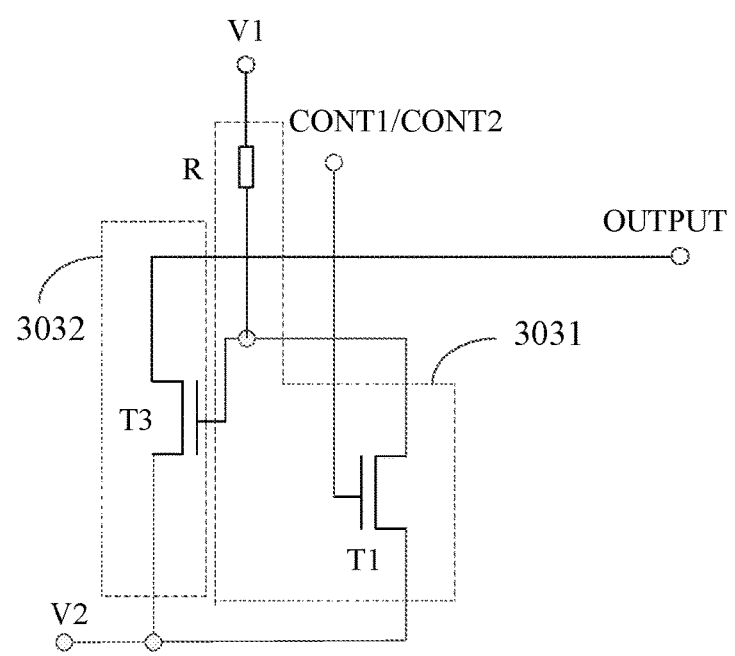
FIG. 3A shows an example circuit of an output control circuit according to some embodiments of the present disclosure.

FIG. 3A shows an example circuit of an output control circuit according to some embodiments of the present disclosure. As shown in FIG. 3A, in an output control circuit according to some embodiments of the present disclosure, a first control sub-circuit 3031 may include a first transistor T1 and a first resistor R. A gate of the first transistor T1 is connected to receive a first control voltage signal Cont1 or a second control voltage signal Cont2, a first electrode of the first transistor T1 is connected to receive a second voltage signal V2, and a second electrode of the first transistor T1 is connected to a first terminal of the first resistor R. A second terminal of the first resistor R is connected to a first voltage signal terminal receiving the first voltage signal V1. A second control sub-circuit 3032 may include a third transistor T3, a gate of the third transistor T3 is connected to the second electrode of the first transistor T1 and the first terminal of the first resistor R, a first electrode of the third transistor T3 is connected to receive the second voltage signal V2, and a second electrode of the third transistor T3 is connected to the output signal terminal OUTPUT.

According to some embodiments of the present disclosure, the first voltage signal terminal may be configured to maintain inputting the first voltage signal V1 as a high-level signal, and the second voltage signal terminal may be configured to maintain inputting the second voltage signal V2 as a low-level signal, and the following examples are described in the same way. According to some embodiments of the present disclosure, the first voltage signal V1 is a high-level DC signal and the second voltage signal V2 is a low-level DC signal. For example, the first voltage signal V1 may be 34V, and the second voltage terminal V2 may be grounded, that is, zero potential. In addition, the second voltage signal V2 may also be a system voltage of −16V.

According to some embodiments of the present disclosure, the first resistor R is a divider resistor for generating voltage drop across two terminals of the divider resistor, such that a voltage $V_{T3\_g}$ applied to the gate of the third transistor T3 will not be too high. For example, the first resistor R may have a resistance of 4.7 KΩ.

Figure 3B:
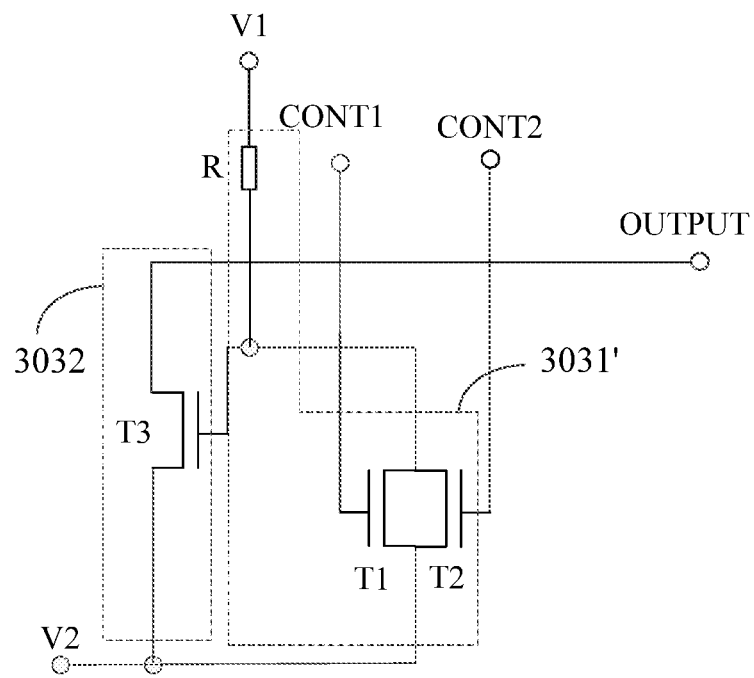
FIG. 3B shows an example circuit of an output control circuit according to some embodiments of the present disclosure.

FIG. 3B shows an example circuit of an output control circuit according to some embodiments of the present disclosure. As shown in FIG. 3B, a difference between FIG. 3B and FIG. 3A is that a first control sub-circuit 3031' further includes a second transistor T2 in FIG. 3B. A gate of the second transistor T2 is connected to receive the second control voltage signal Cont2, a first electrode of the second transistor T2 is connected to receive the second voltage signal V2, and a second electrode of the second transistor T2 is connected to the first terminal of the first resistor R.

Figure 4A:
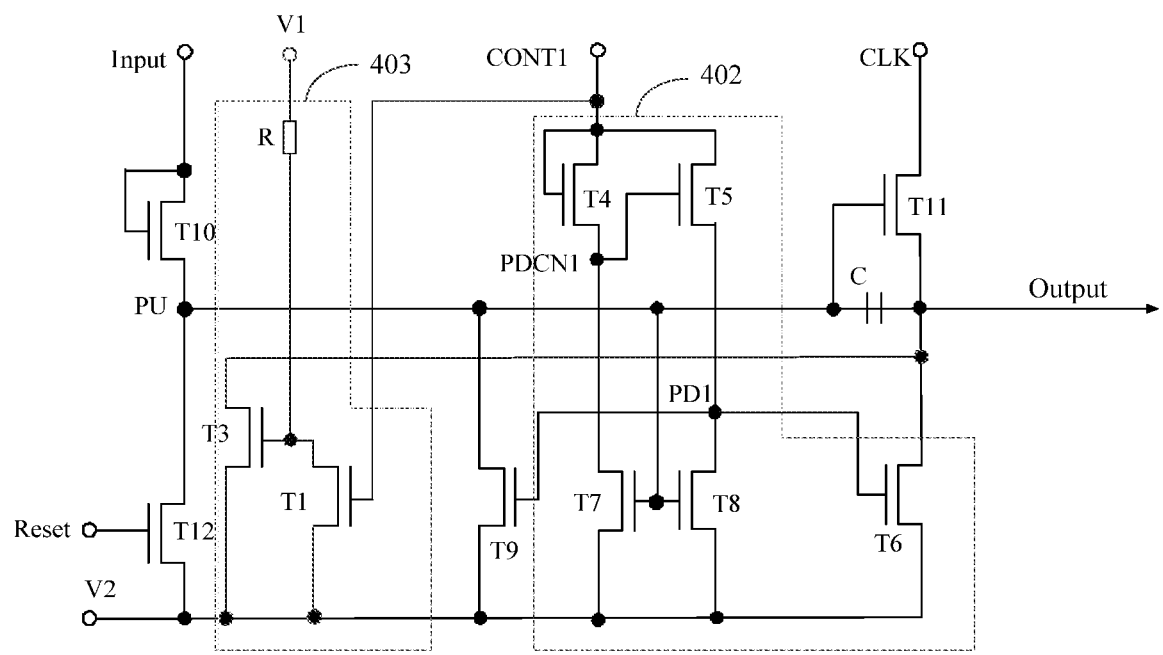
FIG. 4A shows an example circuit of a shift register unit according to some embodiments of the present disclosure.

FIG. 4A shows an example circuit of a shift register unit according to some embodiments of the present disclosure. As shown in FIG. 4A, a pull-down control circuit according to some embodiments of the present disclosure may include a first pull-down control circuit 402. The first pull-down control circuit 402 may include a fourth transistor T4, a fifth transistor T5 and a sixth transistor T6. A gate and a first electrode of the fourth transistor T4 are connected to receive a first control voltage signal V1, and a second electrode of the fourth transistor T4 is connected to a gate of the fifth transistor T5. A first electrode of the fifth transistor T5 is connected to receive the first control voltage signal V1, and a second electrode of the fifth transistor T5 is connected to a gate of the sixth transistor T6. A first electrode of the sixth transistor T6 is connected to receive a second voltage signal V2, and a second electrode of the sixth transistor T6 is connected to an output signal terminal OUTPUT.

An output control circuit 403 may include a first transistor T1 and a first resistor R. A gate of the first transistor T1 is connected to receive a first control voltage signal Cont1 or a second control voltage signal Cont2, a first electrode of the first transistor T1 is connected to receive the second voltage signal V2, and a second electrode of the first transistor T1 is connected to a first terminal of the first resistor R. A second terminal of the first resistor R is connected to a first voltage signal terminal receiving the first voltage signal V1. The output control circuit 403 may include a third transistor T3, a gate of the third transistor T3 is connected to the second electrode of the first transistor T1 and the first terminal of the first resistor R, a first electrode of the third transistor T3 is connected to receive the second voltage signal V2, and a second electrode of the third transistor T3 is connected to the output signal terminal OUTPUT.

As shown in FIG. 4A, the first pull-down control circuit 402 may further include a transistor T7 and a transistor T8. The transistor T7 may be configured to pull down a voltage of node PDCN1 under control of the pull-up control node PU, and the transistor T8 may be configured to pull down a voltage of node PD1 under control of the pull-up control node PU.

As shown in FIG. 4A, the shift register unit according to some embodiments of the present disclosure may further include an input circuit. The input circuit may include a transistor T10 configured to pull up a voltage of the pull-up control node PU in response to an input signal Input.

The shift register unit according to some embodiments of the present disclosure may further include a pull-up control circuit. The pull-up control circuit may include a transistor T9 configured to pull down the voltage of the pull-up control node PU by using the second voltage signal V2 in response to that the pull-down control node PD1 becomes a high level.

The shift register unit according to some embodiments of the present disclosure may further include a reset circuit. The reset circuit may include a transistor T12 configured to reset the voltage of the pull-up control node PU to a voltage of the second voltage signal V2 in response to a reset signal Reset.

The output circuit of the shift register unit may include a transistor T11 and a capacitor C. The output circuit is configured to receive a clock signal Clk and output the clock signal Clk to the output signal terminal OUTPUT under control of a voltage of a pull-up control node PU.

It will be understood by those skilled in the art that the reset circuit may also be configured to reset the voltage of the output signal terminal OUTPUT to the voltage of the second voltage signal V2 in response to the reset signal Reset. In addition, the reset circuit may also be configured to reset the voltage of the pull-up control node PU of all the shift register units connected in cascades in the gate driver in response to a total reset signal, such as a STV signal, before each frame of the pictures is to be displayed.

It will be understood by those skilled in the art that, according to some embodiments of the present disclosure, the output circuit, the reset circuit and the input circuit may have other circuit structures as long as the related functions may be realized, which will not be described for the sake of simplicity.

Figure 4B:
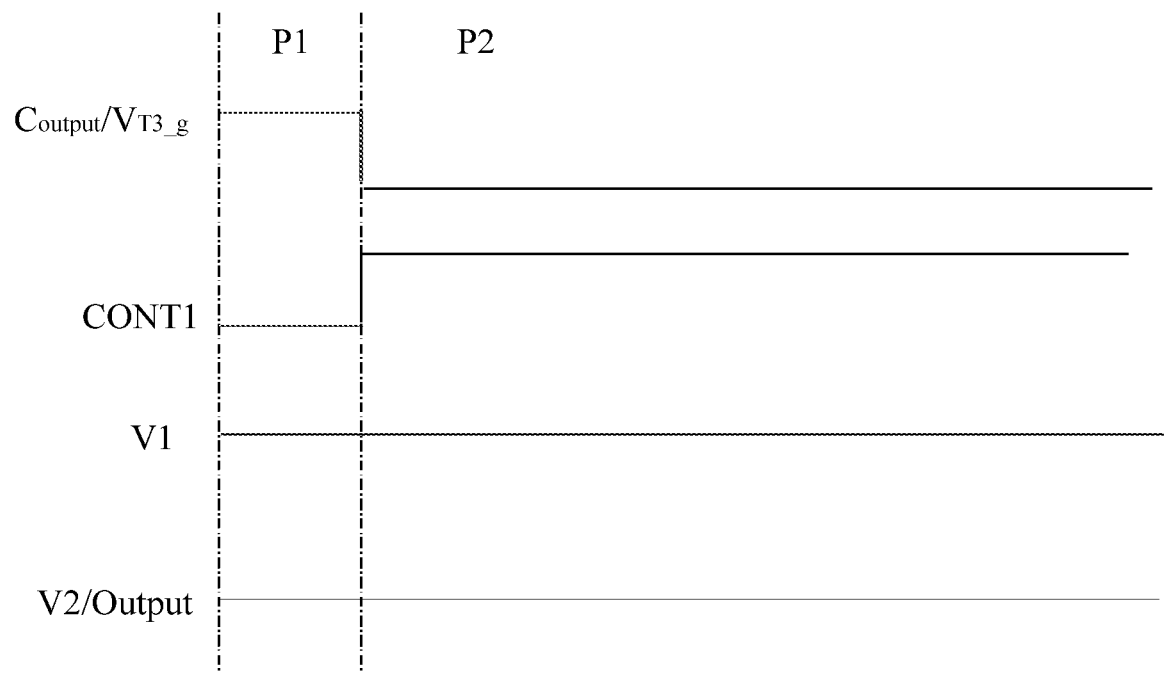
FIG. 4B shows a signal timing diagram of a shift register unit according to some embodiments of the present disclosure.
Figure 4C:
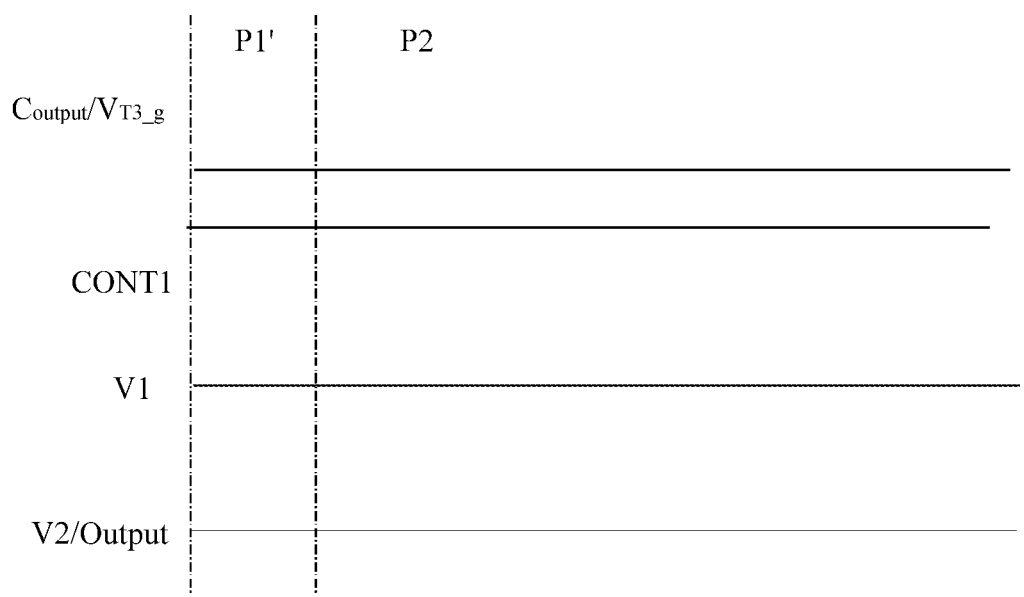
FIG. 4C shows a signal timing diagram of a shift register unit according to some embodiments of the present disclosure.

FIG. 4B shows a signal timing diagram of a shift register unit shown in FIG. 4A, FIG. 4C shows another signal timing diagram of a shift register unit shown in FIG. 4A. The operation of the shift register unit according to some embodiments of the present disclosure will be described hereinafter with reference to FIG. 4A, FIG. 4B and FIG. 4C. In an initial power supply phase P1 of the shift register unit, a voltage of the first control voltage signal Cont1 is unstable, and the voltage may be low or high.

As shown in FIG. 4B, in the initial power supply phase P1, the first control voltage signal Cont1 is at a low level, the first transistor T1 is turned off, and the first voltage signal V1 is applied to the gate of the third transistor T3 after the divider resistor R. For example, in an example where the first voltage signal V1 is 34V and the first resistor R is 4.7 KΩ, the output control signal Coutput ($V_{T3\_g}$) applied to the gate of the third transistor T3 is about 32V, so the gate voltage of the third transistor T3 is at a high level and the third transistor T3 is turned on, thereby the second voltage signal V2 is supplied to the output signal terminal OUTPUT. The output signal terminal OUTPUT may maintain at a low level, that is, the output signal terminal OUTPUT is at an ineffective level.

In a normal display phase P2, the first control voltage signal Cont1 is stabilized to a high level, and the first transistor T1 is turned on, thereby applying the second voltage signal V2 to the gate of the third transistor T3. The output control signal Coutput ($V_{T3\_g}$) is at a low level and the third transistor T3 is turned off. It can be seen that the output control circuit according to some embodiments of the present disclosure does not substantially affect the operation of the shift register unit. Therefore, in the phase P2 where the display device operates normally, the shift register unit operates according to a normal operation process. For example, operations may be performed with reference to FIG. 1A and FIG. 1B.

As shown in FIG. 4C, in an initial power supply phase P1', the first control voltage signal Cont1 is at a high level, the first transistor T1 is turned on, and the second voltage signal V2 is applied to the gate of the third transistor T3. The gate voltage of the third transistor T3 $V_{T3\_g}$ is at a low level and the third transistor T3 is turned off. The first control voltage signal Cont1 is at a high level, such that the fourth transistor T4 and the fifth transistor T5 are turned on, the pull-down control node PD1 become high level, and the sixth transistor T6 is turned on, thereby the second voltage signal V2 is supplied to the output signal terminal OUTPUT. The output signal terminal OUTPUT may maintain at a low level, that is, the output signal terminal OUTPUT is at an ineffective level. In this case, when the first control voltage signal Cont1 is at a high level, the output control circuit according to some embodiments of the present disclosure does not substantially affect the operation of the shift register unit, which can be understood by those skilled in the art, essentially corresponds to the normal operation state of the display device. Therefore, similar to FIG. 4B, in a phase P2 where the display device operates normally, the shift register unit operates according to a normal operation process.

Figure 5A:
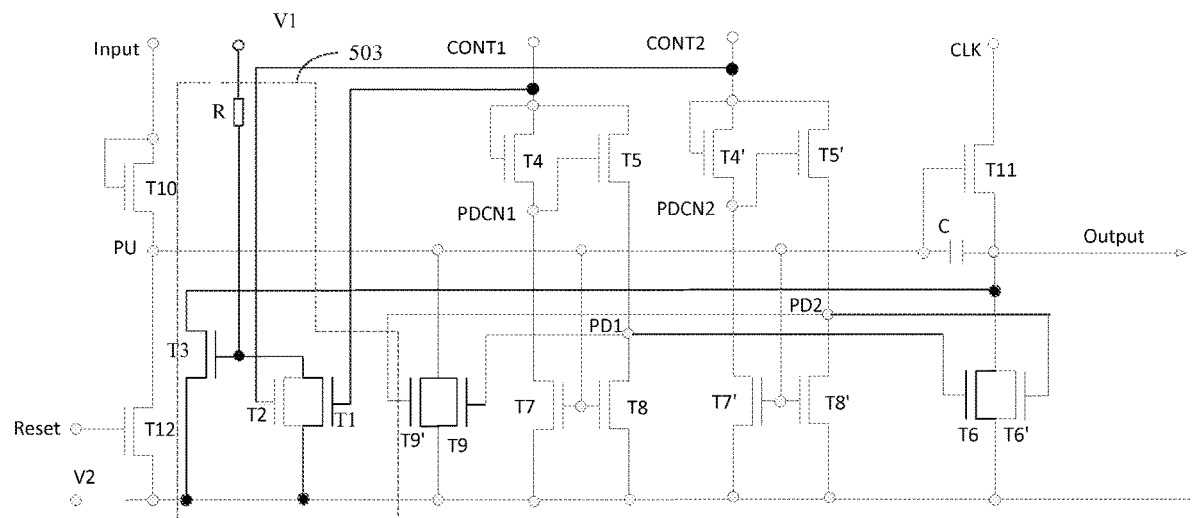
FIG. 5A shows an example circuit of a shift register unit according to some embodiments of the present disclosure.

FIG. 5A shows an example circuit of a shift register unit according to some embodiments of the present disclosure. As shown in FIG. 5A, a pull-down control circuit according to some embodiments of the present disclosure may include a first pull-down control circuit and a second pull-down control circuit. The first pull-down control circuit may include a fourth transistor T4, a fifth transistor T5 and a sixth transistor T6. A gate and a first electrode of the fourth transistor T4 are connected to receive a first control voltage signal Cont1, and a second electrode of the fourth transistor T4 is connected to a gate of the fifth transistor T5. A first electrode of the fifth transistor T5 is connected to receive the first control voltage signal Cont1, and a second electrode of the fifth transistor T5 is connected to a gate of the sixth transistor T6. A first electrode of the sixth transistor T6 is connected to receive a second voltage signal V2, and a second electrode of the sixth transistor T6 is connected to the output signal terminal OUTPUT.

The pull-down control circuit may further include a second pull-down control circuit and an output control sub-circuit 503'. The output control sub-circuit 503' may include a second transistor T2.

As shown in FIG. 5A, the second pull-down control circuit may include a seventh transistor T4', an eighth transistor T5', and a ninth transistor T6'. A gate and a first electrode of the seventh transistor T4' are connected to receive a second control voltage signal Cont2, and a second electrode of the seventh transistor T4' is connected to a gate of the eighth transistor T5'. A first electrode of the eighth transistor T5' is connected to receive the second control voltage signal Cont2, and a second electrode of the eighth transistor T5' is connected to a gate of the ninth transistor T6'. A first electrode of the ninth transistor T6' is connected to receive a second voltage signal V2, and a second electrode of the ninth transistor T6' is connected to the output signal terminal OUTPUT.

As shown in FIG. 5A, the output control sub-circuit 503' may further include a second transistor T2. A gate of the second transistor T2 is connected to receive the second control voltage signal Cont2, a first electrode of the second transistor T2 is connected to receive the second voltage signal V2, and a second electrode of the second transistor T2 is connected to the first terminal of the first resistor R.

As shown in FIG. 5A, the first pull-down control circuit may further include a tenth transistor T7 and an eleventh transistor T8. A gate of the tenth transistor T7 is connected to a pull-up control node PU, a first electrode of the tenth transistor T7 is connected to the second electrode of the fourth transistor, and a second electrode of the tenth transistor is connected to receive the second voltage signal. A gate of the eleventh transistor T8 is connected to the pull-up control node PU, a first electrode of the eleventh transistor T8 is connected to the second electrode of the fifth transistor, and a second electrode of the eleventh transistor T8 is connected to receive the second voltage signal. The tenth transistor T7 may be configured to pull down a voltage of node PDCN1 under control of the pull-up control node PU, and the eleventh transistor T8 may be configured to pull down a voltage of node PD1 under control of the pull-up control node PU.

Similarly, the second pull-down control circuit may further include a twelfth transistor T7' and a thirteenth transistor T8'. A gate of the twelfth transistor T7' is connected to the pull-up control node PU, a first electrode of the twelfth transistor T7' is connected to the second electrode of the seventh transistor, and a second electrode of the twelfth transistor T7' is connected to receive the second voltage signal. A gate of the thirteenth transistor T8' is connected to the pull-up control node PU, a first electrode of the thirteenth transistor T8' is connected to the second electrode of the eighth transistor, and a second electrode of the thirteenth transistor T8' is connected to receive the second voltage signal. The twelfth transistor T7' may be configured to pull down a voltage of node PDCN2 under control of the pull-up control node PU, and the thirteenth transistor T8' may be configured to pull down a voltage of node PD2 under control of the pull-up control node PU.

As shown in FIG. 5A, the shift register unit according to some embodiments of the present disclosure may further include an input circuit. The input circuit may include a transistor T10 configured to pull up a voltage of the pull-up control node PU in response to an input signal Input.

The shift register unit according to some embodiments of the present disclosure may further include a pull-up control circuit. The pull-up control circuit may include a transistor T9 and a transistor T9', which are configured to pull down a voltage of the pull-up control node PU by using the second voltage signal V2 in response to that the pull-down control node PD1 and the pull-down control node PD2 become a high level respectively.

The shift register unit according to some embodiments of the present disclosure may further include a reset circuit. The reset circuit may include a transistor T12 configured to reset the voltage of the pull-up control node PU to the voltage of the second voltage signal V2 in response to a reset signal Reset.

The output circuit of the shift register unit may include a transistor T11 and a capacitor C. The output circuit is configured to receive a clock signal Clk and output the clock signal Clk to an output signal terminal OUTPUT under control of a voltage of a pull-up control node PU.

It will be understood by those skilled in the art that the reset circuit may also be configured to reset the voltage of the output signal terminal OUTPUT to a voltage of the second voltage signal V2 in response to the reset signal Reset. In addition, the reset circuit may also be configured to reset the voltage of the pull-up control node PU of all the shift register units connected in cascades in the gate driver in response to a total reset signal, such as a STV signal, before each frame of the pictures is to be displayed.

It will be understood by those skilled in the art that, according to some embodiments of the present disclosure, the output circuit, the reset circuit and the input circuit may have other circuit structures as long as the related functions may be realized, which will not be described for the sake of simplicity.

Figure 5B:
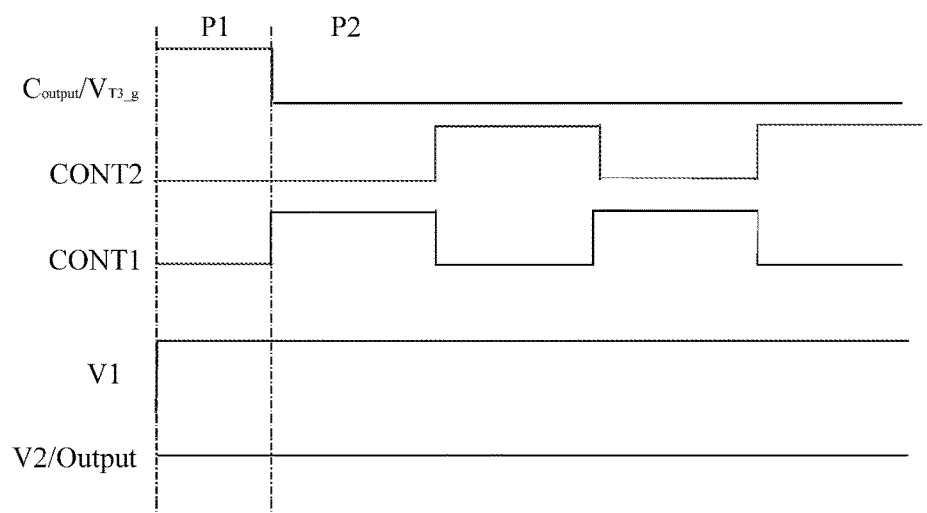
FIG. 5B shows a signal timing diagram of a shift register unit according to some embodiments of the present disclosure.
Figure 5C:
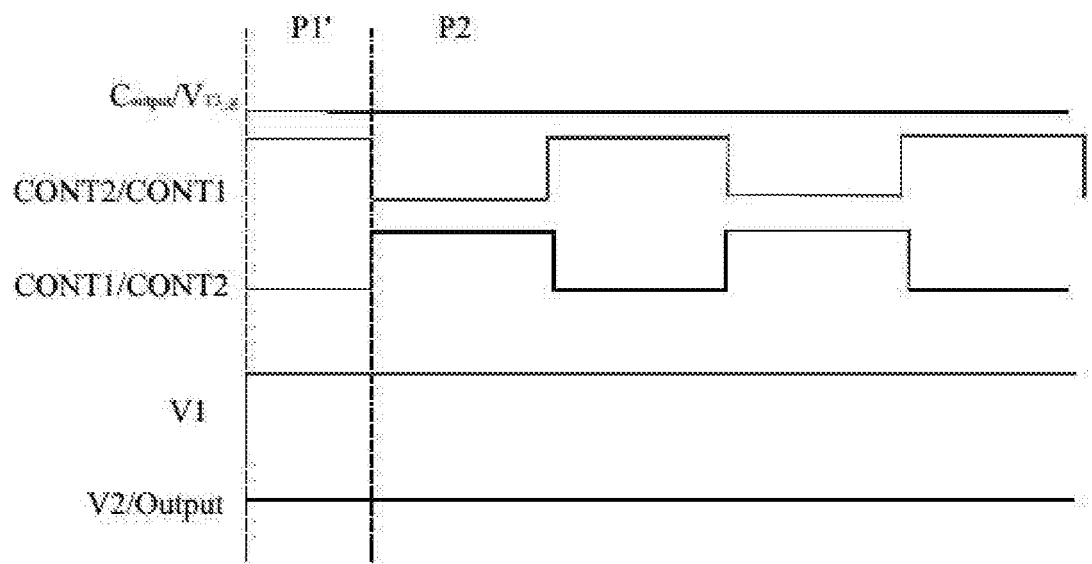
FIG. 5C shows a signal timing diagram of a shift register unit according to some embodiments of the present disclosure.
Figure 5D:
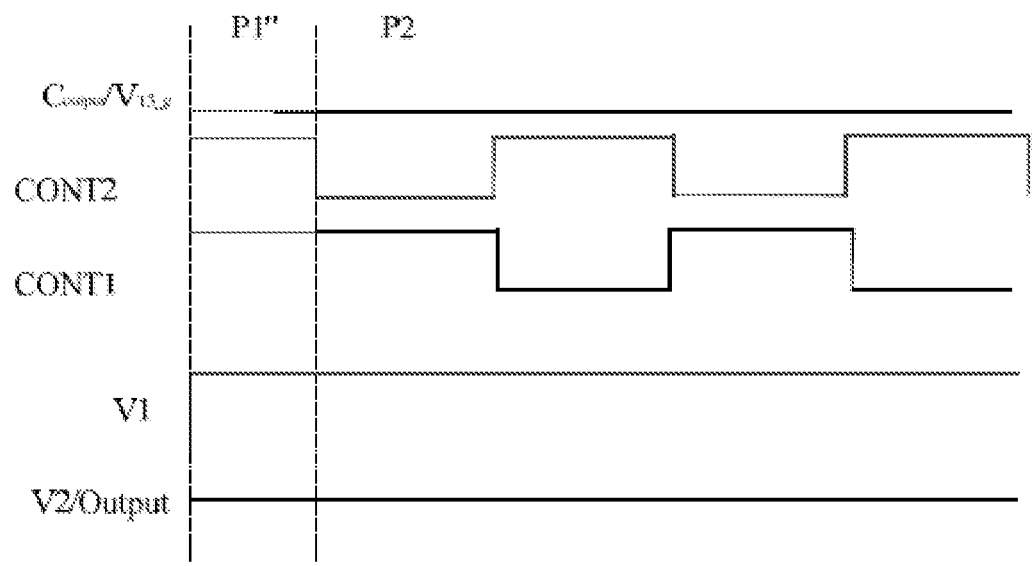
FIG. 5D shows a signal timing diagram of a shift register unit according to some embodiments of the present disclosure.

FIG. 5B shows a signal timing diagram of a shift register unit shown in FIG. 5A, FIG. 5C shows another signal timing diagram of a shift register unit shown in FIG. 5A, and FIG. 5D shows still another signal timing diagram of a shift register unit shown in FIG. 5A. The operation of the shift register unit according to some embodiments of the present disclosure will be described hereinafter with reference to FIG. 5A, FIG. 5B, FIG. 5C and FIG. 5D. In an initial power supply phase P1 of the shift register unit, a voltage of the first control voltage signal Cont1 and a voltage of the second control voltage signal Cont2 are unstable, and the voltages may be low or high.

As shown in FIG. 5B, in the initial power supply phase P1, the first control voltage signal Cont1 and the second control voltage signal Cont2 are both at a low level, a first transistor T1 is turned off, the second transistor T2 is turned off, and a first voltage signal V1 is applied to a gate of a third transistor T3 after the divider resistor R. For example, in an example where the first voltage signal V1 is 34V and the first resistor R is 4.7 KΩ, the output control signal Coutput ($V_{T3\_g}$) applied to the gate of the third transistor T3 is about 32V, so the gate voltage of the third transistor T3 is at a high level and the third transistor T3 is turned on, thereby the second voltage signal V2 is supplied to the output signal terminal OUTPUT. The output signal terminal OUTPUT may maintain at a low level, that is, the output signal terminal OUTPUT is at an ineffective level.

In a normal display phase P2, one of the first control voltage signal Cont1 and the second control voltage signal Cont2 is at a high level, the other is at a low level, one of the first transistor T1 and the second transistor T2 is turned on, thereby applying the second voltage signal V2 to the gate of the third transistor T3. The output control signal Coutput ($V_{T3\_g}$) is at a low level and the third transistor T3 is turned off. It can be seen that the output control circuit according to some embodiments of the present disclosure does not substantially affect the operation of the shift register unit. Therefore, in the phase P2 where the display device operates normally, the shift register unit operates according to a normal operation process. For example, operations may be performed with reference to FIG. 1A and FIG. 1B.

As shown in FIG. 5C, in an initial power supply phase P1', one of the first control voltage signal Cont1 and the second control voltage signal Cont2 is at a high level, the other is at a low level, one of the first transistor T1 and the second transistor T2 is turned on, thereby applying the second voltage signal V2 to the gate of the third transistor T3. The gate voltage $V_{T3\_g}$ of the third transistor T3 is at a low level and the third transistor T3 is turned off. One of the first control voltage signal Cont1 and the second control voltage signal Cont2 is at a high level, such that one of the fourth transistor T4 and the seventh transistor T4' is turned on, the fifth transistor T5 and the eighth transistor T5' are turned on, the pull-down control node PD1 and the pull-down control node PD2 become high level, and the sixth transistor T6 and the ninth transistor T6' are turned on, thereby the second voltage signal V2 is supplied to the output signal terminal OUTPUT. The output signal terminal OUTPUT may maintain at a low level, that is, the output signal terminal OUTPUT is at an ineffective level. That is, when one of the first control voltage signal Cont1 and the second control voltage signal Cont2 is at a high level, the other is at a low level, the output control circuit according to some embodiments of the present disclosure does not substantially affect the operation of the shift register unit, as can be understood by those skilled in the art, such state essentially corresponds to the normal operation state of the display device. Therefore, similar to FIG. 5A, in a phase P2 where the display device operates normally, the shift register unit operates according to a normal operation process.

As shown in FIG. 5D, in an initial power supply phase P1", the first control voltage signal Cont1 and the second control voltage signal Cont2 are both at a high level, the first transistor T1 is turned on, the second transistor T2 is turned on, and the first voltage signal V2 is applied to the gate of the third transistor T3. The output control signal Coutput ($V_{T3\_g}$) is at a low level, and the third transistor T3 is turned off. The first control voltage signal Cont1 is at a high level, such that the fourth transistor T4 is turned on, the fifth transistor T5 is turned on, the pull-down control node PD1 becomes high level, and the sixth transistor T6 is turned on, thereby the second voltage signal V2 is supplied to the output signal terminal OUTPUT. The output signal terminal OUTPUT may maintain at a low level, that is, the output signal terminal OUTPUT is at an ineffective level. Meanwhile, the second control voltage signal Cont2 is at a high level, such that the seventh transistor T4' and the eighth transistor T5' are turned on, the pull-down control node PD2 becomes high level, and the ninth transistor T6' is turned on, thereby the second voltage signal V2 is supplied to the output signal terminal OUTPUT. The output signal terminal OUTPUT may maintain at a low level, that is, the output signal terminal OUTPUT is at an ineffective level.

In a normal display phase P2, one of the first control voltage signal Cont1 and the second control voltage signal Cont2 is at a high level, the other is at a low level. As mentioned above, the output control signal Coutput ($V_{T3\_g}$) is at a low level and the third transistor T3 is turned off. The output control circuit according to some embodiments of the present disclosure does not substantially affect the operation of the shift register unit. Therefore, in the phase P2 where the display device operates normally, the shift register unit operates according to a normal operation process.

Figure 6:
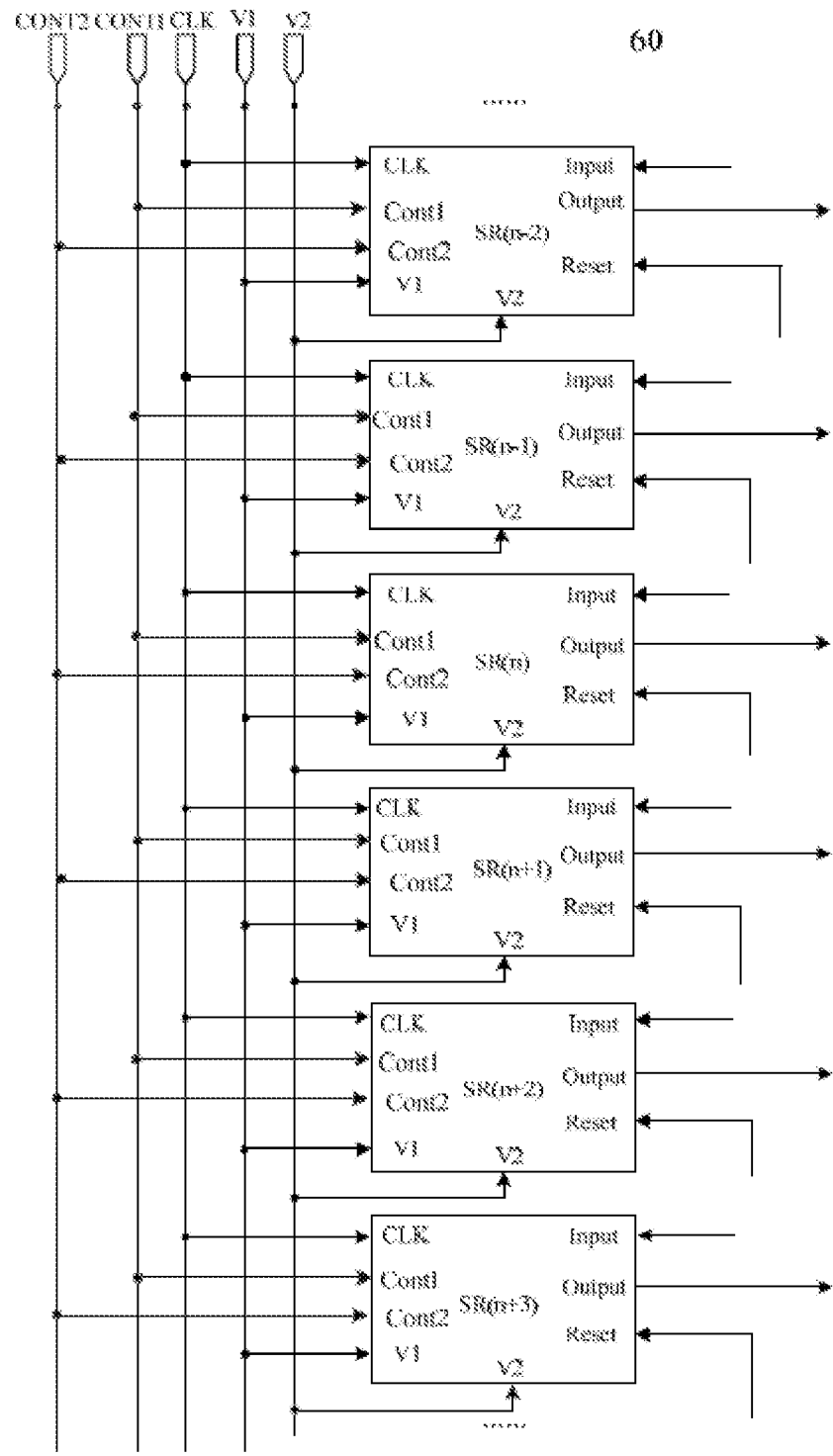
FIG. 6 shows an example schematic diagram of a gate driver according to some embodiments of the present disclosure.

According to some embodiments of the present disclosure, a gate driver is also provided. FIG. 6 shows an example schematic diagram of a gate driver 60 according to some embodiments of the present disclosure. As shown in FIG. 6, the gate driver 60 according to some embodiments of the present disclosure may include a control voltage signal line configured to provide a control voltage signal Cont. The gate driver may further include a first voltage signal line configured to provide a first voltage signal V1. The gate driver 60 may further include N stages of the shift register units according to some embodiments of the present disclosure, wherein N is an integer larger than or equal to 2.

For example, the control voltage signal line CONT may include a first control voltage signal line CONT1 configured to provide a first control voltage signal Cont1; and a second control voltage signal line CONT2 configured to provide a second control voltage signal Cont2.

It will be understood by those skilled in the art that the output control circuit according to some embodiments of the present disclosure may be located inside the shift register unit, as illustrated by an example of the gate driver shown in FIG. 6.

Figure 7:
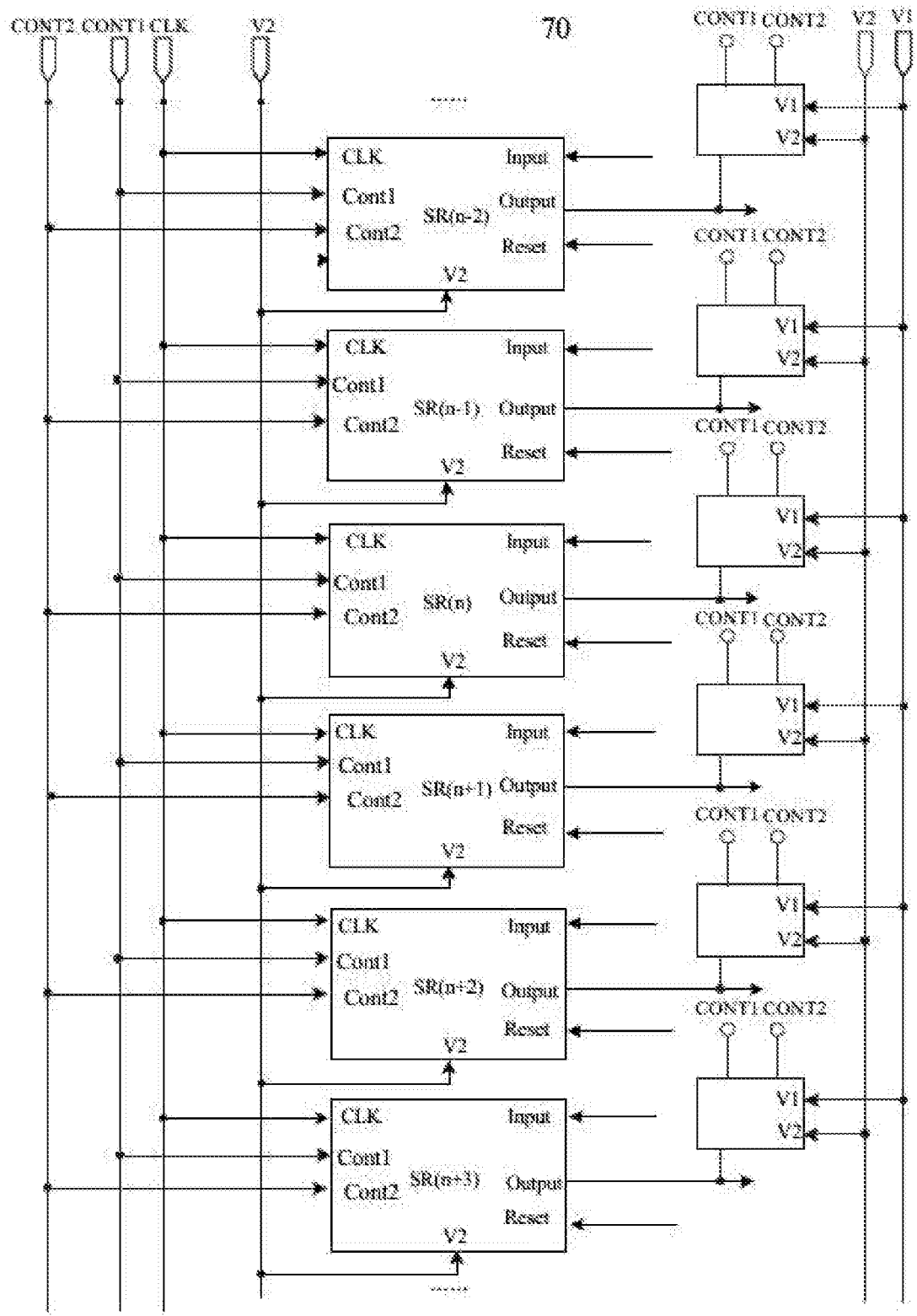
FIG. 7 shows an example schematic diagram of a gate driver according to some embodiments of the present disclosure.

According to some embodiments of the present disclosure, a gate driver is also provided. FIG. 7 shows an example schematic diagram of a gate driver according to some embodiments of the present disclosure. As shown in FIG. 7, the gate driver 70 according to some embodiments of the present disclosure may include a control voltage signal line CONT configured to provide a control voltage signal Cont. The gate driver 70 may further include a first voltage signal line configured to provide a first voltage signal V1. The gate driver 70 may further include N shift register units connected in cascades, wherein N is an integer larger than or equal to 2; and N output control circuits according to some embodiments of the present disclosure.

For example, the control voltage signal line CONT may include a first control voltage signal line CONT1 configured to provide a first control voltage signal Cont1 and a second control voltage signal line CONT2 configured to provide a second control voltage signal Cont2.

It will be understood by those skilled in the art that the output control circuit according to some embodiments of the present disclosure may be provided external to the shift register unit, as illustrated by an example of the gate driver shown in FIG. 7.

It will be understood by those skilled in the art that, although only one clock signal is shown in the examples of FIG. 6 and FIG. 7 for the sake of simplicity, the gate driver according to some embodiments of the present disclosure is equally applicable to situations where there are multiple clock signals, such as six or eight clock signals. In addition, a total reset signal may be set in the gate driver according to some embodiments of the present disclosure, and all shift register units may be totally reset at an initial stage of display of each frame by using, for example, a STV signal.

Figure 8:
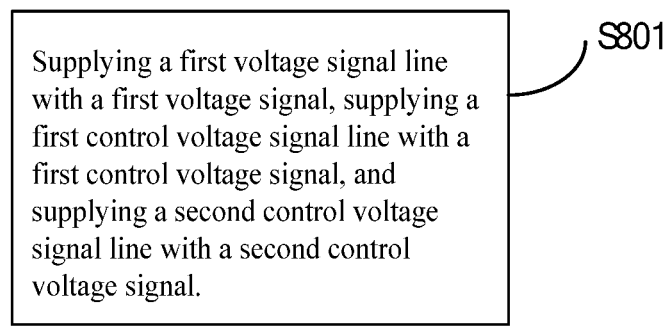
FIG. 8 shows a flow chart of a driving method for driving a gate driver according to some embodiments of the present disclosure.

FIG. 8 shows a flow chart of a driving method for driving a gate driver according to some embodiments of the present disclosure. It will be understood by those skilled in the art that the driving method may be applied to the gate drivers in some embodiments of the present disclosure, such as the gate drivers shown in FIG. 6 and FIG. 7. It should be noted that, the sequence number of each step in the following method is used only as a representation of the step for description, and should not be regarded as a representation of an execution order of each step. Unless explicitly stated, the method does not need to be performed precisely in a shown order. As shown in FIG. 8, a driving method 80 for driving the gate driver according to some embodiments of the present disclosure may include the following steps.

Step S801, supplying a first voltage signal line with a first voltage signal, supplying a first control voltage signal line with a first control voltage signal; and supplying a second control voltage signal line with a second control voltage signal.

Figure 9:
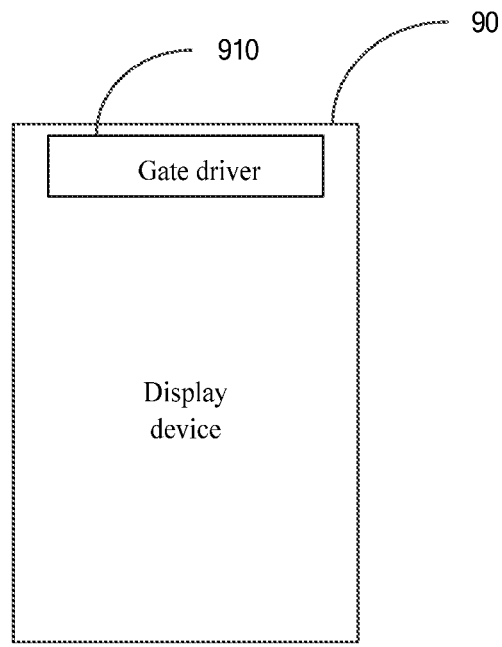
FIG. 9 shows a schematic block diagram of a display device according to some embodiments of the present disclosure.

FIG. 9 shows a schematic block diagram of a display device according to some embodiments of the present disclosure. As shown in FIG. 9, the display device 90 may include a gate driver 910 according to some embodiments of the present disclosure. The display device 90 according to some embodiments of the present disclosure may be any product or component with display function such as electronic paper, mobile phone, tablet computer, television, display, notebook computer, digital photo frame, navigator, etc.

The object, technical solution and beneficial effects of the embodiments of the present disclosure are further described in detail in the specific embodiments described above. It should be understood that the embodiments described above are only specific embodiments of the present disclosure and are not intended to limit the present disclosure. Any modification, equivalent substitution and improvement without departing from the spirit and principle of the present disclosure are within the protection scope of the present disclosure.

What is claimed is:

1. A shift register unit, comprising:
an output circuit, configured to receive a clock signal and output the clock signal to an output signal terminal under control of a voltage of a pull-up control node;
a pull-down control circuit, configured to receive a control voltage signal and control the voltage of the pull-up control node and a voltage of the output signal terminal according to the control voltage signal,
wherein the control voltage signal comprises a first control voltage signal and a second control voltage signal, the first control voltage signal and the second control voltage signal are reverse signals with a same frequency; and
an output control circuit, configured to receive a first voltage signal and the control voltage signal, and control the voltage of the output signal terminal in response to the first voltage signal and the control voltage signal,
wherein the output control circuit comprises:
a first control sub-circuit, configured to generate an output control signal based on at least one of the first control voltage signal and the second control voltage signal;
a second control sub-circuit, configured to receive the output control signal and control the voltage of the output signal terminal in response to the first voltage signal and the output control signal;
wherein the first control sub-circuit consists of a first transistor and a first resistor;
a gate of the first transistor is connected to receive the first control voltage signal, a first electrode of the first transistor is connected to receive a second voltage signal, and a second electrode of the first transistor is connected to a first terminal of the first resistor;
a second terminal of the first resistor is connected to a first voltage signal terminal receiving the first voltage signal.

2. The shift register unit according to claim 1, wherein the first control sub-circuit further comprises a second transistor;
a gate of the second transistor is connected to receive the second control voltage signal, a first electrode of the second transistor is connected to receive the second voltage signal, and a second electrode of the second transistor is connected to the first terminal of the first resistor.

3. The shift register unit according to claim 1, wherein the second control sub-circuit comprises a third transistor, a gate of the third transistor is connected to a second electrode of the first transistor and the first terminal of the first resistor, a first electrode of the third transistor is connected to receive the second voltage signal, and a second electrode of the third transistor is connected to the output signal terminal.

4. The shift register unit according to claim 1, wherein the pull-down control circuit comprises a first pull-down control circuit;
the first pull-down control circuit comprises a fourth transistor, a fifth transistor and a sixth transistor;
a gate and a first electrode of the fourth transistor are connected to receive a first control voltage signal, and a second electrode of the fourth transistor is connected to a gate of the fifth transistor;
a first electrode of the fifth transistor is connected to receive the first control voltage signal, and a second electrode of the fifth transistor is connected to a gate of the sixth transistor; and
a first electrode of the sixth transistor is connected to receive a second voltage signal, and a second electrode of the sixth transistor is connected to the output signal terminal.

5. The shift register unit according to claim 4, wherein the first pull-down control circuit further comprises a tenth transistor and an eleventh transistor;
a gate of the tenth transistor is connected to the pull-up control node, a first electrode of the tenth transistor is connected to the second electrode of the fourth transistor, and the second electrode of the tenth transistor is connected to receive the second voltage signal;
a gate of the eleventh transistor is connected to the pull-up control node, a first electrode of the eleventh transistor is connected to the second electrode of the fifth transistor, and a second electrode of the eleventh transistor is connected to receive the second voltage signal.

6. The shift register unit according to claim 4, wherein the pull-down control circuit comprises a second pull-down control circuit;
the second pull-down control circuit comprises a seventh transistor, an eighth transistor and a ninth transistor;
a gate and a first electrode of the seventh transistor are connected to receive a second control voltage signal, and a second electrode of the seventh transistor is connected to a gate of the eighth transistor;
a first electrode of the eighth transistor is connected to receive the second control voltage signal, and a second electrode of the eighth transistor is connected to a gate of the ninth transistor; and
a first electrode of the ninth transistor is connected to receive the second voltage signal, and a second electrode of the ninth transistor is connected to the output signal terminal.

7. The shift register unit according to claim 6, wherein the second pull-down control circuit further comprises a twelfth transistor and a thirteenth transistor;
a gate of the twelfth transistor is connected to the pull-up control node, a first electrode of the twelfth transistor is connected to the second electrode of the seventh transistor, and the second electrode of the twelfth transistor is connected to receive the second voltage signal;
a gate of the thirteenth transistor is connected to the pull-up control node, a first electrode of the thirteenth transistor is connected to the second electrode of the eighth transistor, and a second electrode of the thirteenth transistor is connected to receive the second voltage signal.

8. A gate driver, comprising:
a control voltage signal line, configured to provide a control voltage signal;
a first voltage signal line, configured to provide a first voltage signal; and
N stages of the shift register units according to claim 1, wherein N is an integer larger than or equal to 2.

9. The gate driver according to claim 8, wherein the control voltage signal line comprises:
a first control voltage signal line, configured to provide a first control voltage signal; and
a second control voltage signal line, configured to provide a second control voltage signal.

10. A gate driver, comprising:
a first voltage signal line, configured to provide a first voltage signal;
a control voltage signal line, configured to provide a control voltage signal;
N shift register units connected in cascades, wherein N is an integer larger than or equal to 2; and
N output control circuits;
wherein each of N shift register units connected in cascades comprises:
an output circuit, configured to receive a clock signal and output the clock signal to an output signal terminal under control of a voltage of a pull-up control node;
a pull-down control circuit, configured to receive a control voltage signal and control the voltage of the pull-up control node and a voltage of the output signal terminal according to the control voltage signal,
wherein the control voltage signal comprises at least one of a first control voltage signal and a second control voltage signal, the first control voltage signal and the second control voltage signal are reverse signals with a same frequency;
wherein each of N output control circuits is connected to the pull-down control circuit and the output signal terminal of a corresponding shift register unit, and is configured to receive a first voltage signal and the control voltage signal, and control the voltage of the output signal terminal in response to the first voltage signal and the control voltage signal;
wherein the control voltage signal comprises at least one of a first control voltage signal and a second control voltage signal;
the output control circuit comprises:
a first control sub-circuit, configured to generate an output control signal based on at least one of the first control voltage signal and the second control voltage signal;
a second control sub-circuit, configured to receive the output control signal and control the voltage of the output signal terminal in response to the first voltage signal and the output control signal;

wherein the first control sub-circuit consists of a first transistor and a first resistor;
a gate of the first transistor is connected to receive the first control voltage signal, a first electrode of the first transistor is connected to receive a second voltage signal, and a second electrode of the first transistor is connected to a first terminal of the first resistor;
a second terminal of the first resistor is connected to a first voltage signal terminal receiving the first voltage signal.

11. The gate driver according to claim 10, wherein the control voltage signal line comprises:
a first control voltage signal line, configured to provide a first control voltage signal; and
a second control voltage signal line, configured to provide a second control voltage signal.

12. The gate driver according to claim 10, wherein the first control sub-circuit further comprises a second transistor;
a gate of the second transistor is connected to receive the second control voltage signal, a first electrode of the second transistor is connected to receive the second voltage signal, and a second electrode of the second transistor is connected to the first terminal of the first resistor.

13. The gate driver according to claim 10, wherein the second control sub-circuit comprises a third transistor, a gate of the third transistor is connected to a second electrode of the first transistor and the first terminal of the first resistor, a first electrode of the third transistor is connected to receive the second voltage signal, and a second electrode of the third transistor is connected to the output signal terminal.

14. A driving method for driving the gate driver according to claim 8, comprising:
supplying, a first voltage signal line with a first voltage signal;
supplying, a first control voltage signal line with a first control voltage signal; and
supplying, a second control voltage signal line with a second control voltage signal.

* * * * *